(12) United States Patent
Flynn et al.

(10) Patent No.: US 7,994,814 B1
(45) Date of Patent: Aug. 9, 2011

(54) PROGRAMMABLE TRANSMITTER

(75) Inventors: James P. Flynn, Beaverton, OR (US); John T. Stonick, Portland, OR (US); Daniel K. Weinlader, Allentown, PA (US); Jianping Wen, Beaverton, OR (US); Skye Wolfer, Hillsboro, OR (US); David A. Yokoyama-Martin, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 12/791,750

(22) Filed: Jun. 1, 2010

(51) Int. Cl.
*H03K 17/16* (2006.01)
*H03K 19/003* (2006.01)
(52) U.S. Cl. .................. 326/30; 326/26; 326/32; 326/33
(58) Field of Classification Search .................. None
See application file for complete search history.

(56) References Cited

U.S. PATENT DOCUMENTS

| | | | | |
|---|---|---|---|---|
| 5,666,071 A | * | 9/1997 | Hawkins et al. | 326/86 |
| 5,804,987 A | * | 9/1998 | Ogawa et al. | 326/40 |
| 6,044,417 A | * | 3/2000 | Muljono et al. | 710/52 |

* cited by examiner

*Primary Examiner* — Anh Q Tran
(74) *Attorney, Agent, or Firm* — Park, Vaughan, Fleming & Dowler LLP; Laxman Sahasrabuddhe (57) ABSTRACT

Some embodiments of the present invention provide a programmable transmitter which includes a set of drivers and one or more chains of configuration registers. Each driver is capable of being configured to perform a transmission function from a predetermined set of transmission functions. Each configuration register can correspond to a driver, and can store configuration data which is used to configure the corresponding driver. The programmable transmitter can include configuration circuitry which serially shifts configuration data into the one or more chains of configuration registers. The programmable transmitter can also include programming circuitry which can determine configuration data for each driver based partly or solely on a desired transmitter behavior.

16 Claims, 5 Drawing Sheets

PROGRAMMABLE TRANSMITTER

BACKGROUND

1. Technical Field

This disclosure is generally related to programmable transmitters. More specifically, this disclosure is related to a highly flexible programmable transmitter for a high-speed serial-interface.

2. Related Art

Modern communication systems use a number of high-speed communication standards which impose stringent requirements on the behavior of transmitters and receivers. Furthermore, the relentless miniaturization of integrated circuits has increased the amount of variability in the electrical characteristics of chips. Consequently, the operating parameters of a transmitter, such as impedance, attenuation, and equalization (e.g., pre-emphasis and de-emphasis) often need to be programmed during operation.

One approach for designing a programmable transmitter is to include a large number of transmitter legs (e.g., 64 transmitter legs), such that each transmitter leg has multiple configurations. Then, each transmitter leg can be configured to achieve the desired transmitter behavior during operation.

Due to the stringent and potentially conflicting requirements of different high-speed serial-interface standards, it is generally desirable for the transmitter design to be highly configurable. Specifically, it is desirable to ensure that the transmitter design allows each transmitter leg to be configured independently of other transmitter legs. Unfortunately, a highly flexible transmitter design can require a large amount of configuration information to be routed to the transmitter legs, which can substantially increase parasitic capacitance and/or wiring area in the circuit design.

SUMMARY

Some embodiments of the present invention provide a highly configurable transmitter design that does not substantially increase the parasitic capacitance or wiring area in the circuit design. In some embodiments, the programmable transmitter includes a set of drivers, and includes one or more chains of configuration registers. Each driver is capable of being configured to perform a transmission function from a predetermined set of transmission functions. In addition to the transmission of data, the predetermined set of transmission functions can include an impedance function, an attenuation function, an equalization function, a test function, and a tri-state function. Each configuration register corresponds to a driver, and stores configuration data which is used to configure the corresponding driver. The programmable transmitter can include configuration circuitry which can serially shift configuration data into the one or more chains of configuration registers.

In some embodiments, the programmable transmitter can include load circuitry, which configures each driver based partly or solely on the configuration data stored in the corresponding configuration register.

In some embodiments, the programmable transmitter includes programming circuitry which determines configuration data for each driver based partly or solely on a desired transmitter behavior.

Note that only a small number of control wires are needed because the configuration registers are coupled to form one or more chains, and the configuration data is serially shifted into the configuration registers. Furthermore, each transmitter leg can be configured independently from other transmitter legs because a separate configuration register can be used to store the configuration information for each transmitter leg.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Figure 1:
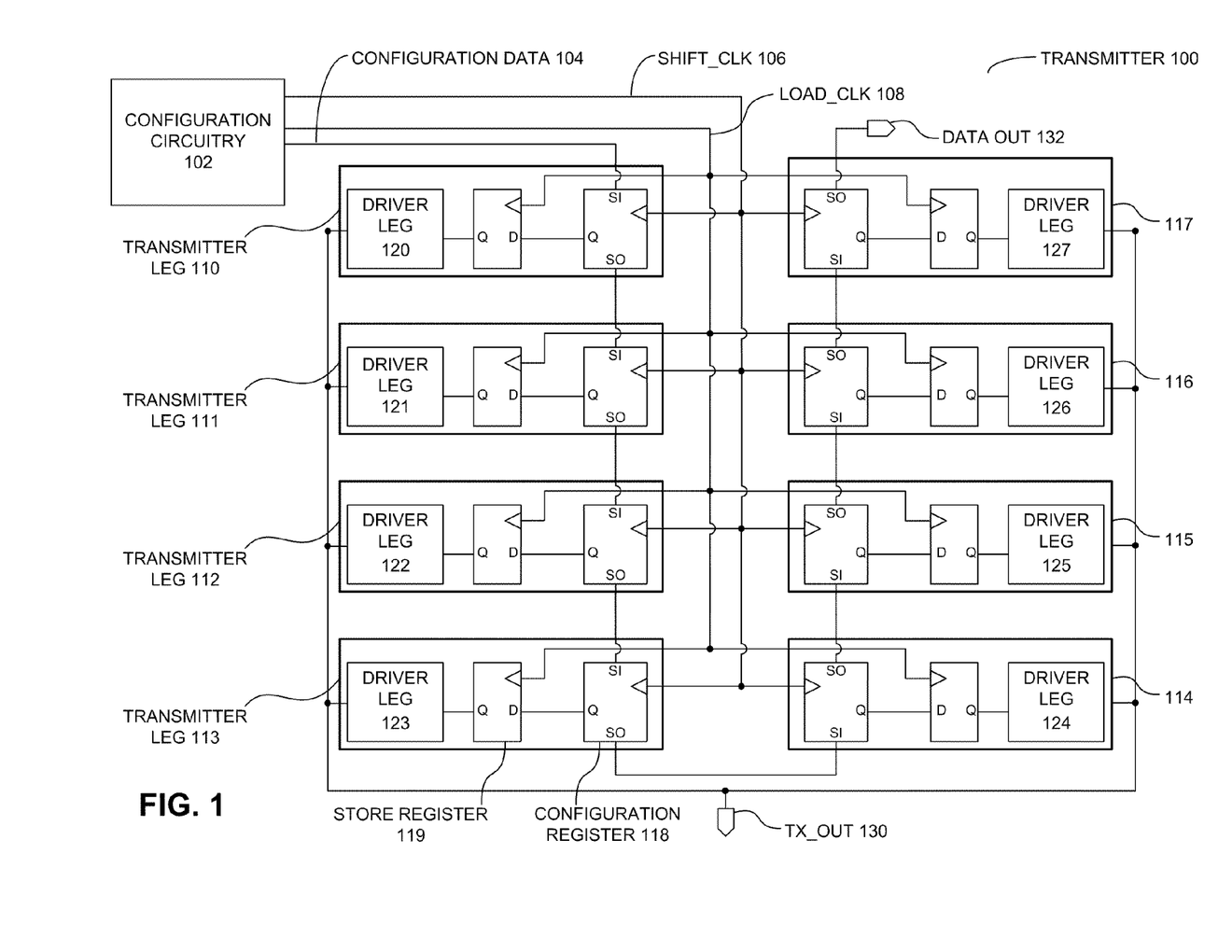
FIG. 1 illustrates a programmable transmitter in accordance with some embodiments of the present invention.

FIG. 1 illustrates a programmable transmitter in accordance with some embodiments of the present invention.

Transmitter 100 includes a set of transmitter legs (e.g., transmitter legs 110-117), and configuration circuitry 102 which programs transmitter legs 110-117 via a serial interface. Each transmitter leg includes a configuration register (e.g., register 118), a store register (e.g., register 119), and a driver leg (e.g., driver leg 123 in transmitter leg 113). The configuration register receives configuration data for the corresponding transmitter leg, and the store register stores the configuration data for use by the corresponding driver leg. Each driver leg is capable of being configured to perform a desired transmission function from a predetermined set of transmission functions.

The set of configuration registers associated with a transmitter's set of transmitter legs are coupled in series, such that the serial-out (SO) signal associated with one transmitter leg (e.g., leg 112) is coupled to the serial-in (SI) signal associated with a neighboring leg (e.g., leg 113). In this manner, the circuitry shown in FIG. 1 facilitates programming driver circuitry 120-127 without using a large number of control wires, thereby reducing wiring area and parasitic capacitance in the circuit layout.

Note that, in contrast to embodiments of the present invention, some approaches use a parallel digital interface to configure transmitter legs. The parasitic capacitance and wiring area is much higher in these approaches because of the large number of control wires that are required in these approaches. For example, a typical programming interface for a transmitter with M transmitter legs and N bits per leg (which encode $2^N$ transmitter leg configurations) would require M*N wires to be routed between the configuration circuitry and the set of transmitter legs. In contrast, in some embodiments of the present invention, configuration circuitry 102 communicates the configuration data to the transmitter legs using three wires which carry configuration data 104, SHIFT_CLK signal 106, and LOAD_CLK signal 108, respectively.

Some approaches reduce the number of control wires by sacrificing flexibility, e.g., by allowing only certain transmitter configurations and encoding these configurations using control words. However, a transmitter that is not fully flexible may not be able to meet the complex and stringent requirements of high-speed serial-interface standards.

It takes longer to configure a transmitter by serially shifting configuration data into the transmitter legs instead of configuring the transmitter legs via a parallel interface. Some embodiments of the present invention are based on the following insight: there is a three-way tradeoff between the number of wires used for configuring the transmitter legs, the amount of configuration flexibility, and the configuration latency. Note that it is not obvious to configure the transmitter legs by serially shifting configuration data into a chain of configuration registers because it increases the configuration latency. Some embodiments of the present invention are based on the following insight: the configuration latency can be sacrificed because a transmitter is not expected to be configured frequently.

During operation, configuration circuitry 102 determines the configuration data for each driver leg based partly or solely on a desired transmitter behavior. Then, configuration circuitry 102 uses SHIFT_CLK 106 to serially shift configuration data 104 into the configuration registers. Once the configuration registers contain the appropriate data, configuration circuitry 102 toggles LOAD_CLK 108 to load the configuration data into the store registers (e.g., store register 119) associated with transmitter legs 110-117. Driver legs 120-127 then perform the corresponding set of transmission functions simultaneously so that they collectively generate the desired signal at the transmitter's output (i.e., TX_OUT 130).

Note that the process of loading a new configuration into transmitter 100 does not disrupt the current data transmission because the driver legs in transmitter 100 are programmed with new configuration data only when LOAD_CLK signal 108 is toggled.

In some embodiments, the transmitter may include two or more configuration registers in each transmitter leg (note that FIG. 1 illustrates a single configuration register per transmitter leg). Each configuration register in a transmitter leg can store a different driver leg configuration. The outputs of the multiple configuration registers in each transmitter leg can be multiplexed together, and the output of the multiplexer can be provided as an input to the store register (e.g., register 119 in FIG. 1). The multiplexer can be controlled using a global select line which can be coupled to the control inputs of all of the configuration register multiplexers in all transmitter legs. This global select line can then be used to switch between different transmitter configurations almost instantaneously. Specifically, the system can serially shift configuration data that corresponds to different transmitter leg configurations into the multiple configuration registers in each transmitter leg. Next, the system can use the global select line to switch from one transmitter leg configuration to another. In this manner, the system can enable the programmable transmitter to switch between two or more preprogrammed transmitter configurations without incurring the latency associated with serially shifting configuration data into the configuration registers.

In some embodiments, the transmitter may include only a configuration register in each transmitter leg instead of including both a configuration register and a store register. In such embodiments, the transmitter behavior may change as soon as new data is shifted into the configuration register. The transmitter behavior will settle to the desired behavior once the entire configuration data has been shifted into the configuration registers.

In some embodiments, transmitter 100 also includes a DATA_OUT signal 132, which can be used during a test or debug operation. For example, the configuration data shifted out of transmitter 100 via DATA_OUT terminal 132 can be monitored to determine the configuration under which the transmitter is operating and/or to ensure that it matches the configuration data that was previously shifted into transmitter 100.

Figure 2:
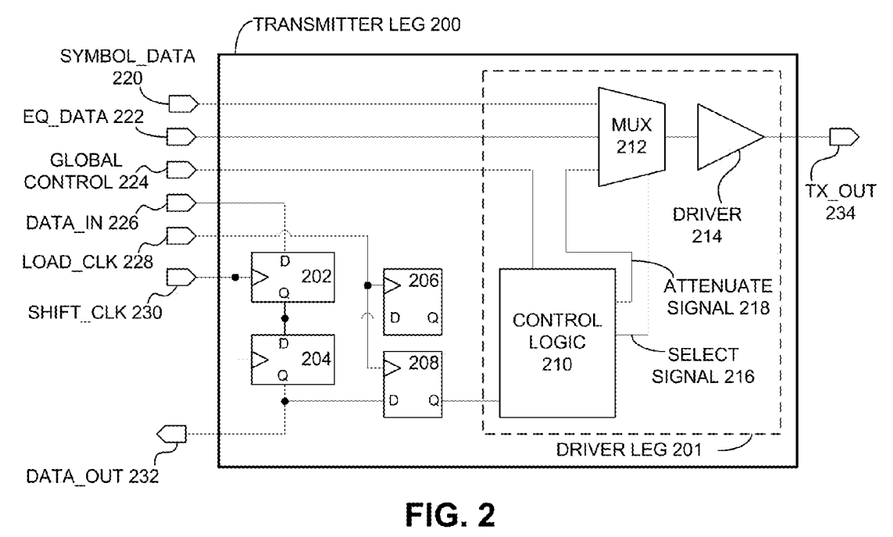
FIG. 2 illustrates a transmitter leg in accordance with some embodiments of the present invention.

FIG. 2 illustrates a transmitter leg in accordance with some embodiments of the present invention.

Transmitter leg 200 includes a set of configuration registers (e.g., registers 202-204), and a set of store registers (e.g., registers 206-208). The configuration registers are coupled together to form a chain, and configuration data is shifted into them via DATA_IN terminal 226 by applying a clock signal to SHIFT_CLK terminal 230. Note that the clocks shown in the figures are single ended, but a differential clock can also be used. Further, store registers 206-208 latch the configuration data in configuration registers 202-204 when LOAD_CLK terminal 228 receives a clock pulse. In some embodiments, configuration registers 202-204 can be a series of shift registers. Note that, when new configuration data is shifted into configuration register 202, the data currently stored in configuration register 202 is shifted out to configuration register 204.

Transmitter leg 200 includes driver leg 201, which includes control logic 210, multiplexer 212, and driver 214. During operation, control logic 210 receives the configuration data from store registers 206-208, and receives global control signal 224 from the set of input signals to transmitter leg 200. The control data stored in registers 206-208 identifies the transmission function that is to be performed by driver 214. Global control terminal 224 receives control signals for features such as AC JTAG (Joint Test Action Group) override, global driver enable, etc.

Next, control logic 210 determines a value for select signal 216, which causes multiplexer 212 to output a value to driver 214, which in turn causes driver 214 to perform the desired transmission function. Specifically, control logic 210 can configure driver 214 to perform an impedance function by configuring multiplexer 212 to provide an appropriate input to driver 214. Specifically, in some embodiments, the output impedance of the transmitter is determined by the number of drivers that are not in the tri-state mode (a driver is in the tri-state mode when it is switched off). A driver performs the impedance function if it is configured to perform a data transmission function (e.g., by providing SYMBOL_DATA 220 to driver 214), an equalization function (e.g., by providing EQ_DATA 222 to driver 214), or an attenuation function (e.g., by providing attenuate signal 218 to driver 214). Once all of the drivers are configured, the desired output signal with the desired impedance is generated at the driver output TX_OUT 234. Any type of driver can benefit from embodiments of the present invention. Specifically, the driver can be a voltage mode driver, a current mode driver, or a hybrid between a voltage mode and current mode driver.

Figure 3:
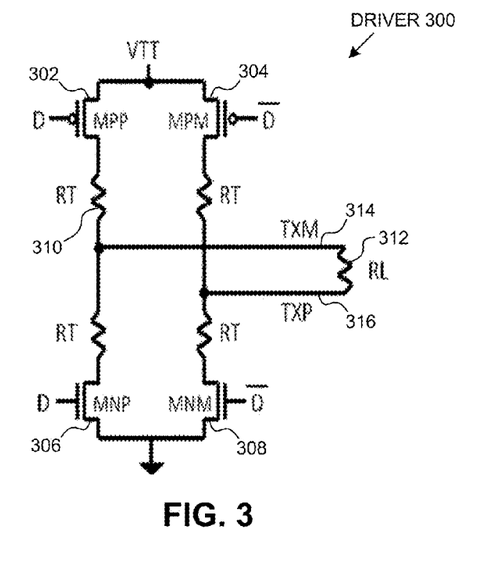
FIG. 3 illustrates a driver in accordance with some embodiments of the present invention.

FIG. 3 illustrates a driver in accordance with some embodiments of the present invention.

Driver 300 includes a set of transistors 302-308, e.g., metal-oxide-semiconductor field-effect-transistors (MOSFETs), and a set of resistors (e.g., resistors 310-312). Transistors 302-304 are p-type, and transistors 306-308 are n-type.

The transmission function performed by driver 300 is determined by the signals that drive the gates of transistors 302-308. For example, the signal D at the gate of transistors 302 and 306 may be provided by the output of multiplexer 212 of FIG. 2. The signal $\overline{D}$ at the gate of transistors 304 and 308 may be generated by inverting the logic value of signal D. Based on the D and $\overline{D}$ values provided, driver 300 generates a differential output on wires 314-316.

Driver 300 can perform different transmission functions depending on the D and $\overline{D}$ values that are provided to it. The system can achieve a desired transmission impedance by configuring the appropriate number of drivers to perform the "impedance" function. Specifically, note that the outputs of the drivers are coupled together at TX_OUT 130. Hence, the system can reduce the impedance seen at the transmitter's output (i.e., TX_OUT 130) by configuring more drivers to perform the "impedance" function. Similarly, a desired amount of equalization and attenuation can be achieved by configuring the appropriate number of drivers to perform the "equalization" and "attenuation" functions. When a driver is not being used, it can be switched off (i.e., configured to perform the "tri-state" function) by providing the appropriate D and $\overline{D}$ values. In this manner, appropriate D and $\overline{D}$ values can be provided to driver 300 to cause driver 300 to perform different functions, such as equalization, attenuation, or to operate in tri-state mode.

Figure 4:
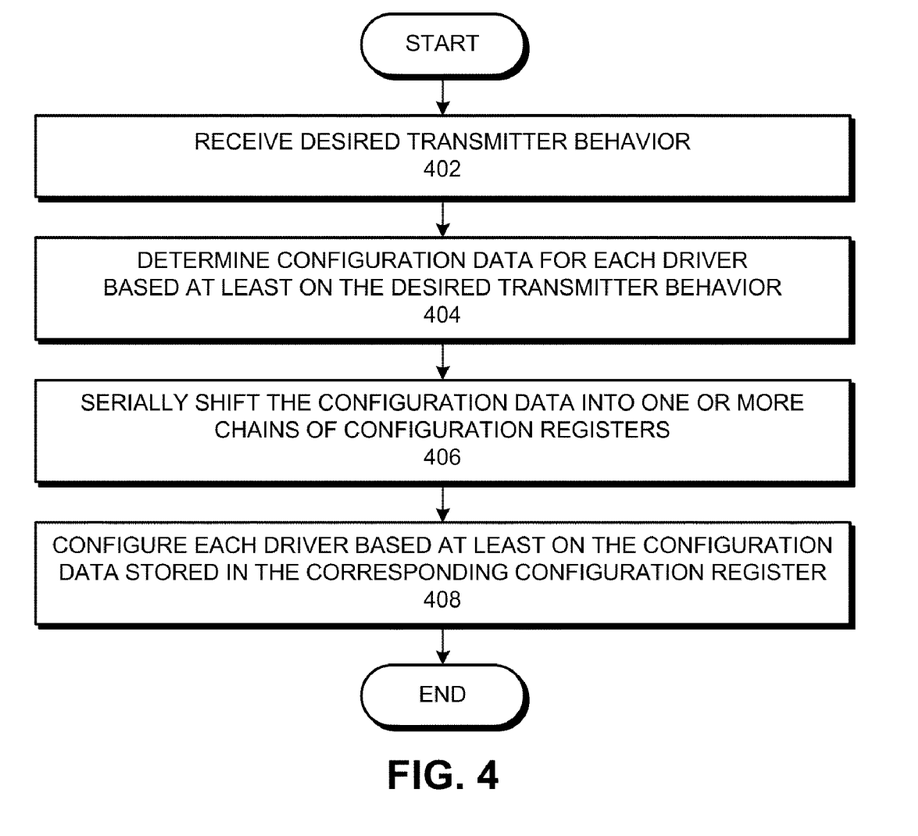
FIG. 4 presents a flow chart illustrating a process for programming a transmitter in accordance with some embodiments of the present invention.

FIG. 4 presents a flow chart illustrating a process for programming a transmitter in accordance with some embodiments of the present invention.

The process can be performed by an electronic system comprising one or more integrated circuits, or can be performed by a computer system which stores instructions and executes these instructions using a processor. The system can begin by receiving a desired transmitter behavior (operation 402), and determining configuration data for each driver leg based on the desired transmitter behavior (operation 404). Next, the system can serially shift the configuration data into the one or more chains of configuration registers (operation 406). The embodiment shown in FIG. 1 illustrates a single chain of configuration registers. In some embodiments, multiple chains of configuration registers may be used to reduce configuration latency by simultaneously shifting multiple streams of configuration bits into the multiple chains. However, creating multiple chains of configuration registers increases the number of control wires that need to be routed to the transmitter legs.

The system then configures each driver leg to perform a desired transmission function based partly or solely on the configuration data stored in the corresponding configuration register (operation 408).

Figure 5:
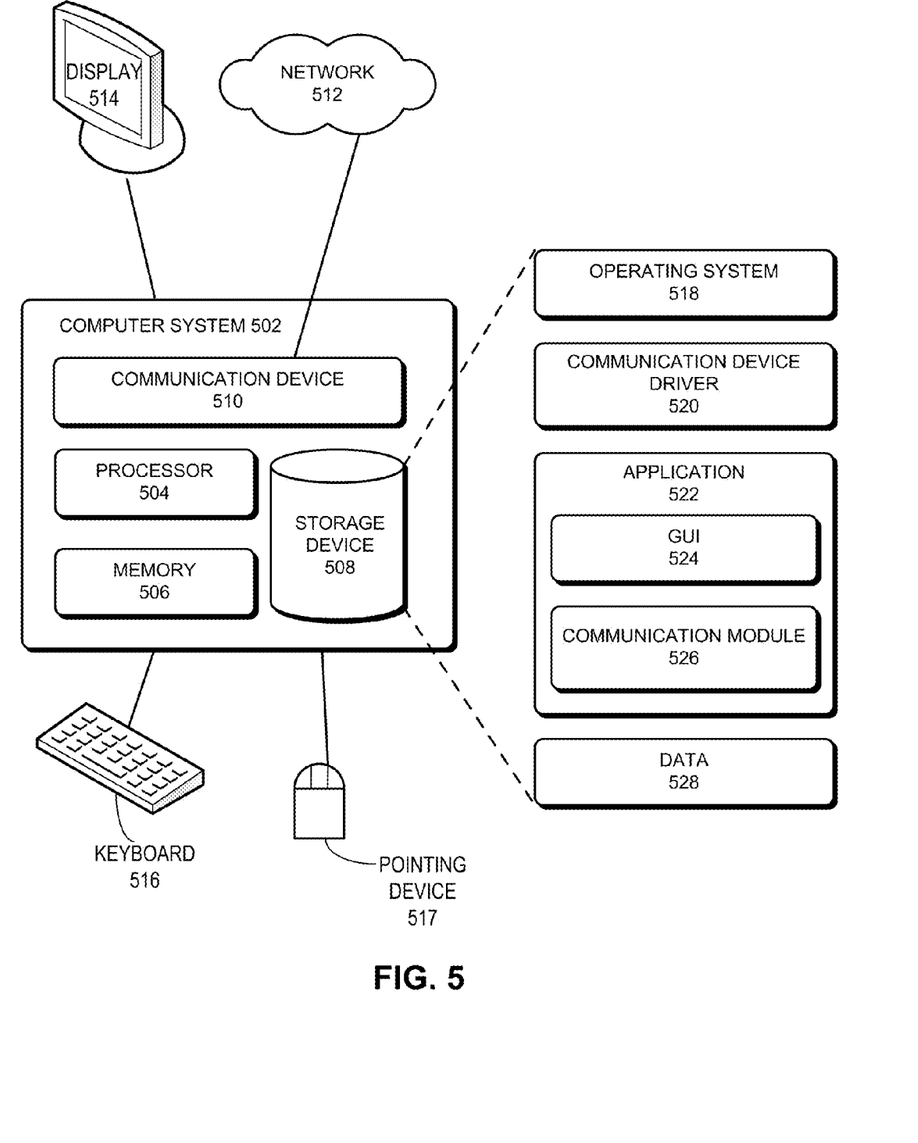
FIG. 5 illustrates a computer system in accordance with some embodiments of the present invention.

FIG. 5 illustrates a computer system in accordance with some embodiments of the present invention.

A computer or computer system can generally be any system that can perform computations. Specifically, a computer can be a microprocessor-based system which may include multiple processing cores, a network-processor-based system, a digital-signal-processor-based system, a portable computing device (e.g., a smart phone), a personal organizer, a distributed-computing-platform-based system, or any other computing system now known or later developed. Computer system 502 includes a processor 504, a memory 506, a storage device 508, and a communication device 510. Computer system 502 can be coupled to a display device 514, a keyboard 516, and a pointing device 517. Furthermore, computer system 502 can use communication device 510 to communicate with other electronic devices via a network 512. Storage device 508 can store operating system 518, a communication device driver 520, applications 522, and data 528.

Application 522 can include instructions, which when executed by computer system 502, can cause computer system 502 to perform methods and/or processes described in this disclosure. Specifically, application 522 can include a graphical user interface (GUI) 524, and can include instructions for processing data 528. Further, communication module 526 can use communication device driver 520 to communicate data 528 with a remote electronic device via network 512.

Data 528 can include any data that is required as input or that is generated as output by the methods and/or processes described in this disclosure. Moreover, communication device driver 520 can include instructions for configuring communication device 510 to transmit data (e.g., data 528) to a remote electronic device via network 512. For example, device driver 520 can determine configuration data for each driver leg of communication device 510. Also, device driver 520 can serially shift the configuration data into the configuration registers of communication device 510 (e.g., configuration registers 202-204 of FIG. 2). Device driver 520 can then configure each driver leg in communication device 510 to perform a transmission function based partly or solely on the configuration data.

Figure 6:
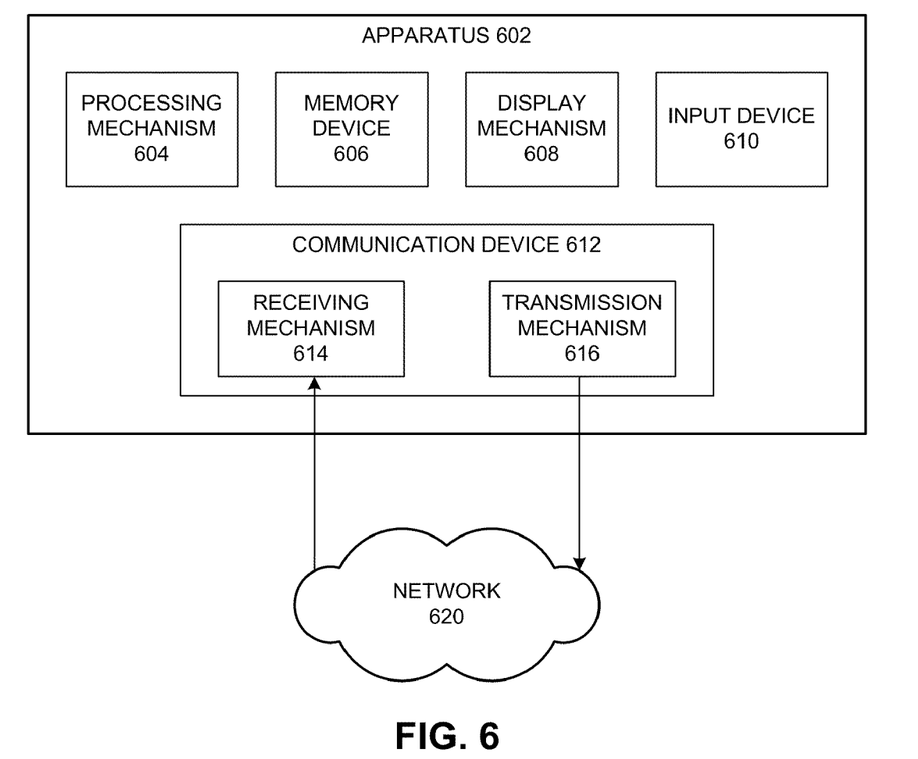
FIG. 6 illustrates an apparatus in accordance with some embodiments of the present invention.

FIG. 6 illustrates an apparatus in accordance with some embodiments of the present invention.

Apparatus 602 can comprise a plurality of mechanisms which may communicate with one another via a wired or wireless communication channel. Apparatus 602 may be realized using one or more integrated circuits, and apparatus 602 may include fewer or more mechanisms than those shown in FIG. 6. Further, apparatus 602 may be integrated in a computer system, or it may be realized as a separate device which is capable of communicating with other computer systems and/or devices. Apparatus 602 can comprise a processing mechanism 604, a memory device 606, a display mechanism 608, an input device 610, and a communication device 612. Specifically, in one embodiment, apparatus 602 can be a smart phone.

During operation, processing mechanism 604 may be configured to read instructions and/or data from memory device 606, and process the instructions and/or data to produce a result. Moreover, processing mechanism 604 can accept input data from a user via input device 610, and can present the result to the user via display mechanism 608 and/or store the result in memory device 606. Further, processing mechanism 604 can use communication device 612 to communicate the data and/or result to a remote computing apparatus via a network 620.

Moreover, communication device 612 includes a receiving mechanism 614, and a transmission mechanism 616. Receiving mechanism 614 may be configured to receive data via network 620, and transmission mechanism 616 may be configured to transmit data via network 620.

During operation, transmission mechanism 616 can determine configuration data for each of its driver legs (e.g., driver legs 120-127 of FIG. 1). Also, transmission mechanism 616 can serially shift the configuration data into the corresponding configuration registers (e.g., configuration register 118 of FIG. 1). Transmission mechanism 616 can then configure each of its driver legs to perform a transmission function based partly or solely on its corresponding configuration data.

CONCLUSION

The above description is presented to enable any person skilled in the art to make and use the embodiments. Various modifications to the disclosed embodiments will be readily apparent to those skilled in the art, and the general principles defined herein are applicable to other embodiments and applications without departing from the spirit and scope of the present disclosure. Thus, the present invention is not limited to the embodiments shown, but is to be accorded the widest scope consistent with the principles and features disclosed herein.

The data structures and code described in this disclosure can be partially or fully stored on a non-transitory computer-readable storage medium and/or a hardware module and/or hardware apparatus. A non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

The methods and processes described in this disclosure can be partially or fully embodied as code and/or data stored in a non-transitory computer-readable storage medium or device, so that when a computer system reads and executes the code and/or data, the computer system performs the associated methods and processes. The methods and processes can also be partially or fully embodied in hardware modules or apparatuses, so that when the hardware modules or apparatuses are activated, they perform the associated methods and processes. Note that the methods and processes can be embodied using a combination of code, data, and hardware modules or apparatuses.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A programmable transmitter, comprising:
    a set of drivers, wherein each driver is capable of being configured to perform a transmission function from a predetermined set of two or more transmission functions, and wherein an output of each driver in the set of drivers is coupled to an output of the programmable transmitter;
    one or more chains of configuration registers, wherein each configuration register corresponds to a driver, and wherein each configuration register stores configuration data which is used to configure the corresponding driver; and
    configuration circuitry which serially shifts configuration data into the one or more chains of configuration registers.

2. The programmable transmitter of claim 1, further comprising load circuitry which configures each driver based partly or solely on configuration data stored in the corresponding configuration register.

3. The programmable transmitter of claim 1, wherein the predetermined set of two or more transmission functions includes two or more of: an impedance function, an attenuation function, and an equalization function.

4. A computer system, comprising:
    a processor;
    a memory; and
    a programmable transmitter, comprising:
        a set of drivers, wherein each driver is capable of being configured to perform a transmission function from a predetermined set of two or more transmission functions, and wherein an output of each driver in the set of drivers is coupled to an output of the programmable transmitter;
        one or more chains of configuration registers, wherein each configuration register corresponds to a driver, and wherein each configuration register stores configuration data which is used to configure the corresponding driver; and
        configuration circuitry which serially shifts configuration data into the one or more chains of configuration registers.

5. The computer system of claim 4, wherein the programmable transmitter further comprises load circuitry which configures each driver based partly or solely on configuration data stored in the corresponding configuration register.

6. The computer system of claim 4, wherein the predetermined set of two or more transmission functions includes two or more of: an impedance function, an attenuation function, and an equalization function.

7. A programmable transmitter, comprising:
    a set of transmitter legs, wherein each transmitter leg comprises:
        a configuration register which stores configuration data; and
        driver circuitry to perform a transmission function from a predetermined set of two or more transmission functions based partly or solely on configuration data stored in the configuration register;
    wherein an output of the driver circuitry in each transmitter leg in the set of transmitter legs is coupled to an output of the programmable transmitter;
    wherein the configuration registers in the set of transmitter legs are serially coupled to form one or more chains of configuration registers; and
    configuration circuitry which serially shifts configuration data into the one or more chains of configuration registers.

8. The programmable transmitter of claim 7, wherein each transmitter leg further comprises load circuitry which configures the transmission circuitry based partly or solely on configuration data stored in the configuration register.

9. The programmable transmitter of claim 7, wherein the predetermined set of two or more transmission functions includes two or more of: an impedance function, an attenuation function, and an equalization function.

10. A computer system, comprising:
    a processor;
    a memory; and
    a programmable transmitter, comprising:
        a set of transmitter legs, wherein each transmission leg comprises:
            a configuration register which stores configuration data; and
            driver circuitry to perform a transmission function from a predetermined set of two or more transmission functions based partly or solely on configuration data stored in the configuration register;
        wherein an output of the driver circuitry in each transmitter leg in the set of transmitter legs is coupled to an output of the programmable transmitter;

wherein the configuration registers in the set of transmitter legs are serially coupled to form one or more chains of configuration registers; and configuration circuitry which serially shifts configuration data into the one or more chains of configuration registers.

11. The computer system of claim 10, wherein each transmitter leg further comprises load circuitry which configures the transmission circuitry based partly or solely on configuration data stored in the configuration register.

12. The computer system of claim 10, wherein the predetermined set of two or more transmission functions includes two or more of: an impedance function, an attenuation function, and an equalization function.

13. The programmable transmitter of claim 1, further comprising:

a set of multiplexers, wherein an output of each multiplexer in the set of multiplexers is coupled to an input of a corresponding driver in the set of drivers, wherein each multiplexer receives a set of signals corresponding to the pre-determined set of two or more transmission functions, and wherein each multiplexer receives a select signal that is based on configuration data for a corresponding driver.

14. The computer system of claim 4, wherein the programmable transmitter further comprises:

a set of multiplexers, wherein an output of each multiplexer in the set of multiplexers is coupled to an input of a corresponding driver in the set of drivers, wherein each multiplexer receives a set of signals corresponding to the pre-determined set of two or more transmission functions, and wherein each multiplexer receives a select signal that is based on configuration data for a corresponding driver.

15. The programmable transmitter of claim 7, wherein each transmitter leg further comprises:

a multiplexer, wherein an output of the multiplexer is coupled to an input of the driver circuitry, wherein the multiplexer receives a set of signals corresponding to the pre-determined set of two or more transmission functions, and wherein the multiplexer receives a select signal that is based on the configuration data.

16. The computer system of claim 10, wherein each transmitter leg further comprises:

a multiplexer, wherein an output of the multiplexer is coupled to an input of the driver circuitry, wherein the multiplexer receives a set of signals corresponding to the pre-determined set of two or more transmission functions, and wherein the multiplexer receives a select signal that is based on the configuration data.

* * * * *